United States Patent
Hyeon et al.

[11] Patent Number: 5,840,609
[45] Date of Patent: Nov. 24, 1998

[54] METHOD OF MANUFACTURING SEMICONDUCTOR DEVICE HAVING STACKED GATE ELECTRODE STRUCTURE

[75] Inventors: Yeong Cheol Hyeon; Hyun Kyu Yu, both of Daejon-Shi, Rep. of Korea

[73] Assignee: Electronics and Telecommunications Research Institute, Daejon-shi, Rep. of Korea

[21] Appl. No.: 951,564

[22] Filed: Oct. 16, 1997

[30] Foreign Application Priority Data

Nov. 4, 1996 [KR] Rep. of Korea .................. 1996 51779

[51] Int. Cl.$^6$ ...................................................... H01L 21/26
[52] U.S. Cl. .......................... 438/299; 438/303; 438/305
[58] Field of Search .................... 438/299, 188, 438/157, 210, 291

[56] References Cited

U.S. PATENT DOCUMENTS

| | | | |
|---|---|---|---|
| 4,366,613 | 1/1983 | Ogura et al. ............................. | 438/252 |
| 5,141,890 | 8/1992 | Haken ..................................... | 438/231 |
| 5,155,053 | 10/1992 | Atkinson . | |
| 5,545,579 | 8/1996 | Liang et al. ............................. | 438/291 |
| 5,580,804 | 12/1996 | Joh .......................................... | 438/231 |
| 5,625,217 | 4/1997 | Chau et al. ............................. | 257/412 |

*Primary Examiner*—Charles L. Bowers, Jr.
*Assistant Examiner*—Craig Thompson
*Attorney, Agent, or Firm*—Jacobson, Price, Holman & Stern, PLLC

[57] ABSTRACT

A method for manufacturing a semiconductor device having a stacked gate electrode structure of self-aligned polysilicon-metal, which is capable of minimizing the variation in structural and electrical characteristics of the gate electrode, while utilizing the manufacturing process of forming a conventional silicone semiconductor memory device, is disclosed. According to the method for manufacturing a semiconductor device of the present invention, the conventional technique generally used in the manufacturing process of forming the silicon semiconductor device can be effectively utilized. Further, an excessive etch loss in the oxide layer can be restrained by using the oxide spacer of the self-aligned oxide layer in forming the metal layer at the gate electrode structure. Furthermore, it has an advantageous effect that the stable electrical characteristics of the resulting device can be obtained by using the polysilicon layer as a basic constituting material of the gate electrode thereof.

5 Claims, 5 Drawing Sheets

METHOD OF MANUFACTURING SEMICONDUCTOR DEVICE HAVING STACKED GATE ELECTRODE STRUCTURE

BACKGROUND OF THE INVENTION

1. Field of the Invention

The present invention relates to a method for manufacturing a semiconductor device, and more particularly, to a method for manufacturing a semiconductor device having a stacked gate electrode structure of self-aligned polysilicon-metal.

2. Description of the Related Art

Generally, methods for forming metal gate electrode according to the prior art have been used as follows:

1) a photoresist lift-off method using a photoresist layer;
2) a method used by the combination of a gilding technology and an evaporating technology, in order to deposit metal layer;
3) a method used by substituting a gate electrode material with a metallic material or a silicide material; and
4) a method constructed such that a gate electrode is formed by depositing a silicide layer or a salicide layer on a polysilicon layer and a source electrode, drain electrode and gate electrode is finally connected by depositing a metal layer of aluminum (Al).

An example of self-aligned gate electrode structure manufactured by the conventional method may be referred to a gate structure formed by a silicide or salicide technology. This technology is widely used in the conventional method for manufacturing a semiconductor device. According to this technology, a gate electrode of polysilicon layer is deposited on a substrate. A refractory metal, such as titanium (Ti), tungsten (W), molybdenum (Mo) and etc., is deposited thereon and is then silicided by performing a heat treatment.

However, this technique has a disadvantage that since it has a problem in the contamination of the sample to be used and the heat treatment process when the metal, such as for example Al, having a low melting point is used therein, it is inappropriate in the manufacturing technology for applying it to the process of forming the metal gate electrode. Further, in the technique for forming a metal gate electrode used the III–V group compound semiconductor device, it also has a technical problem to apply it to the manufacturing process of forming a silicon semiconductor device. Specially, according to the methods, such as the photoresist lift-off method and the gilding technology, it is difficult to be applied to the CMOS manufacturing process. Furthermore, since the metal materials used in the metal gate electrode is mainly utilized other than to use the Aluminum type material which is generally used in the CMOS manufacturing process, it is too difficult in manufacturing the metal gate by applying these methods to the silicon memory device.

Therefore, it is an object of the present invention to overcome the above disadvantages and provide a method for manufacturing a semiconductor device having a stacked gate electrode structure of self-aligned polysilicon-metal, which is capable of minimizing the variation in structural and electrical characteristics of the gate electrode, while utilizing the manufacturing process of forming a silicon semiconductor memory device.

SUMMARY OF THE INVENTION

A method for manufacturing a semiconductor device of the present invention is defined by the claims with a specific embodiment shown in the attached drawings. For the purpose of summarizing the invention, the invention relates to a semiconductor device having a stacked gate electrode structure comprising the step of preparing a silicon substrate. A field oxide layer is formed on a portion of the silicon substrate. A gate oxide layer is grown on the silicon substrate. A first polysilicon layer, first oxide layer and second polysilicon layer are sequentially deposited on the entire surface of the resulting structure. A first photoresistive layer is coated on the second polysilicon layer and a predetermined portion of the first photoresistive layer is then removed to form a mask pattern for gate electrode at a predetermined portion on the second polysilicon layer. The second polysilicon layer, the first oxide layer, the first polysilicon layer and the gate oxide layer are sequentially removed using the mask pattern for gate electrode to thereby define a gate electrode structure and the mask pattern for gate electrode is then removed. An impurity having a low density is introduced into the entire surface of the resulting structure to form a lightly doped diffusion region at the both side of the gate electrode structure into the silicon substrate. A second oxide layer is then deposited on the entire surface of the resulting structure. An oxide spacer is formed at the both side of the gate electrode structure by a dry etching process of the second oxide layer. An impurity having a high density is introduced into the entire surface of the resulting structure to define a source region and a drain region into the lightly doped diffusion region of the silicon substrate. An doped oxide layer used as an interdielectric layer is deposited on the entire surface of the resulting structure including the oxide spacer and the field oxide layer. The doped oxide layer is heated and is locally planarized the top surface of the doped oxide layer. A spin-on glass layer is coated on the doped oxide layer to secondary planarize the surface of the resulting structure. The resulting structure planarized by the doped oxide layer and the Spin on Glass layer is then removed by performing a SOG etch-back process, until the top surface of the second polysilicon layer in the gate structure is exposed. The exposed second polysilicon layer and the underlying first oxide layer are sequentially removed to expose the top surface of the first polysilicon layer in the gate structure. A second photoresist layer is then coated on the entire surface of the resulting structure and develop to form a mask pattern for contact hole, thereby exposing portions of the doped oxide layer above the source region and the drain region. The exposed portions of the doped oxide layer are removed by using oxide etch processing to define the contact holes for the source region and the drain region. And then photoresist is removed all. A metal layer is deposited on the entire surface of the resulting structure. A metal line is formed on the source region, drain region and gate electrode structure by removing portions of the metal layer, thereby forming a source electrode, a drain electrode and a gate electrode which are respectively electrically connected to the source region, drain region and gate electrode structure.

The method for manufacturing the semiconductor device having a stacked gate electrode structure of self-aligned polysilicon-metal according to the present invention can minimize the variation in structural and electrical characteristics of the gate electrode, while using the manufacturing process of forming a silicon semiconductor memory device. According to the method of the present invention, the metal layer, such as a low resistive Aluminum, is deposited on the gate electrode structure of self-aligned polysilicon-metal, instead of depositing the refractory metal, such as the silicide, utilizing a self-aligned method. The process of forming the source electrode, drain electrode and gate electrode is performed simultaneously with the deposition process and the etching process of the primary metal layer, such that the process of forming the metal layer can perform using the conventional method. Further, the formation of the metal gate pattern by using the self-aligned method according to the present invention will eliminate the etch loss in an oxide layer which may be presented during the etching process due to the mis-alignment of the pattern in the photolithography which is widely used for forming the conventional gate pattern.

BRIEF DESCRIPTION OF THE DRAWINGS

For fuller understanding of the nature and objects of the invention, reference should be made to the following detailed description taken in conjunction with the accompanying drawings, where like reference numerals are used to identify like or similar elements in the various drawings and in which.

DETAILED DESCRIPTION OF THE INVENTION

Figure 1A:
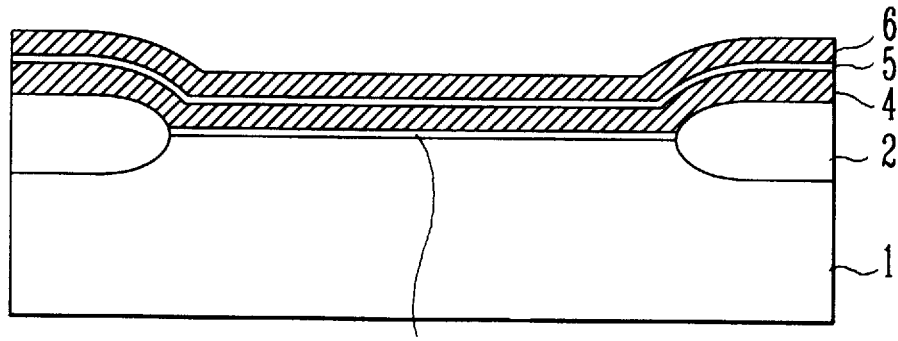
FIGS. 1A to 1N are process steps sequentially illustrating a method for manufacturing a semiconductor device having a stacked gate electrode structure of self-aligned polysilicon-metal according to the present invention.
Figure 1B:
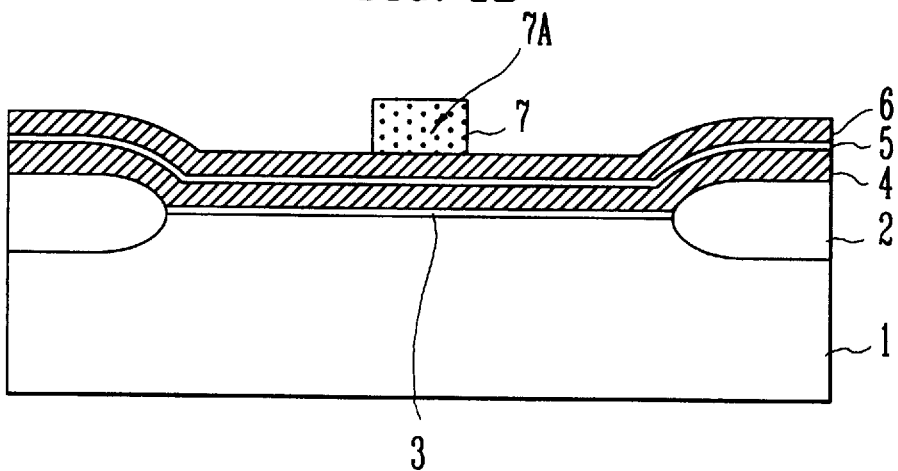
Figure 1C:
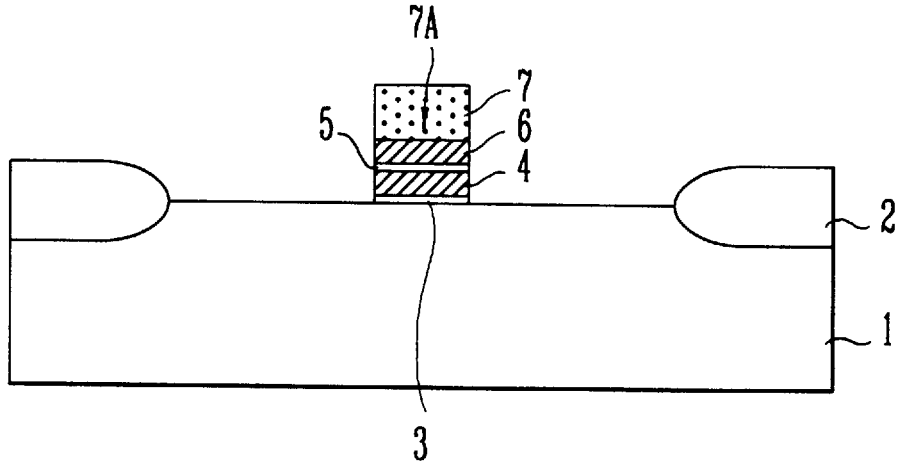
Figure 1D:
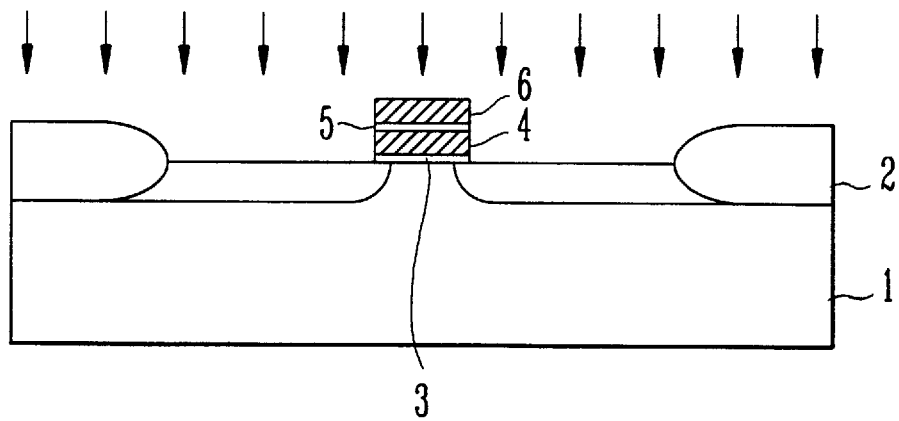
Figure 1E:
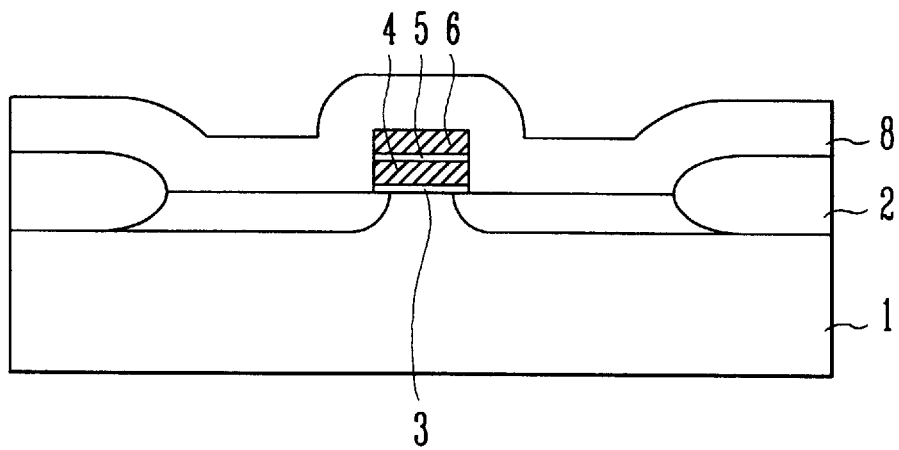
Figure 1F:
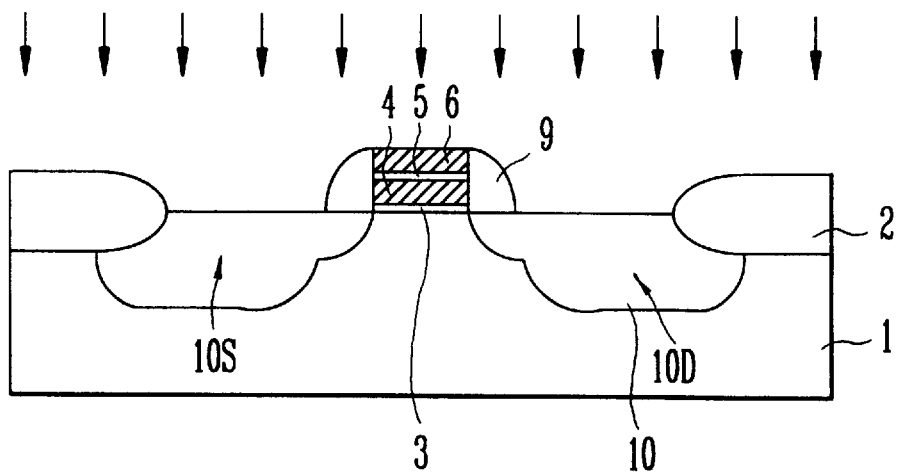
Figure 1G:
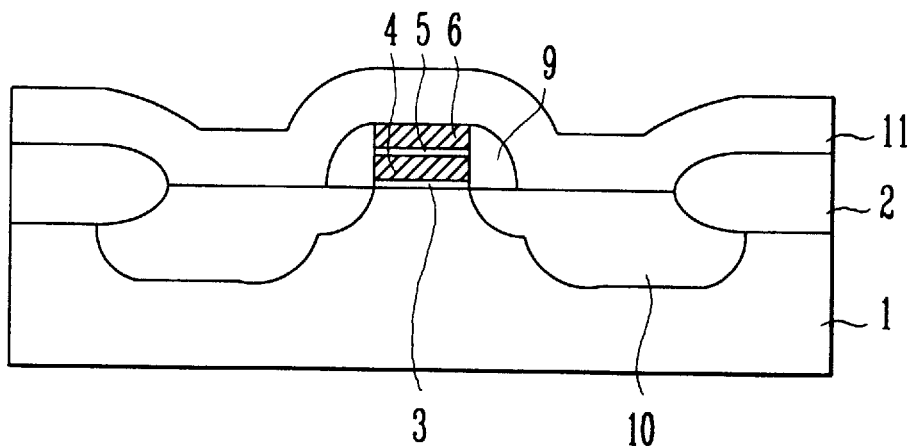
Figure 1H:
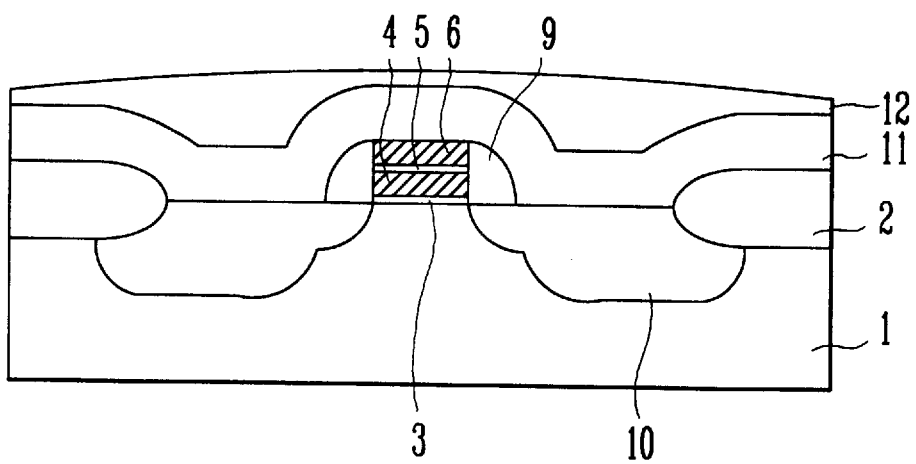
Figure 1I:
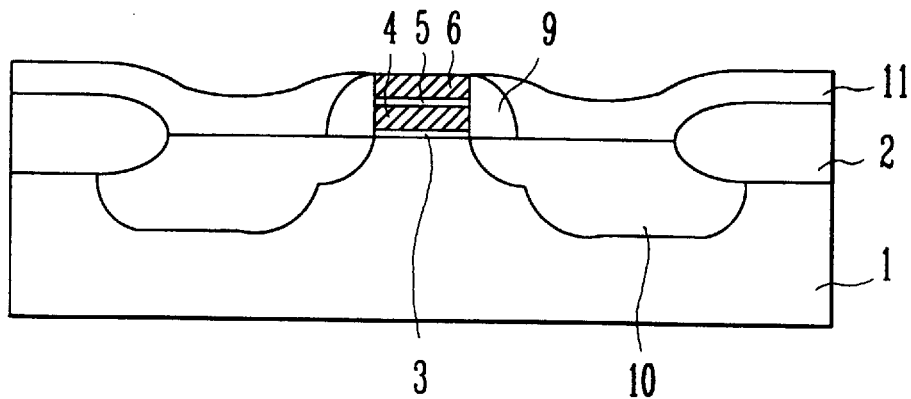
Figure 1J:
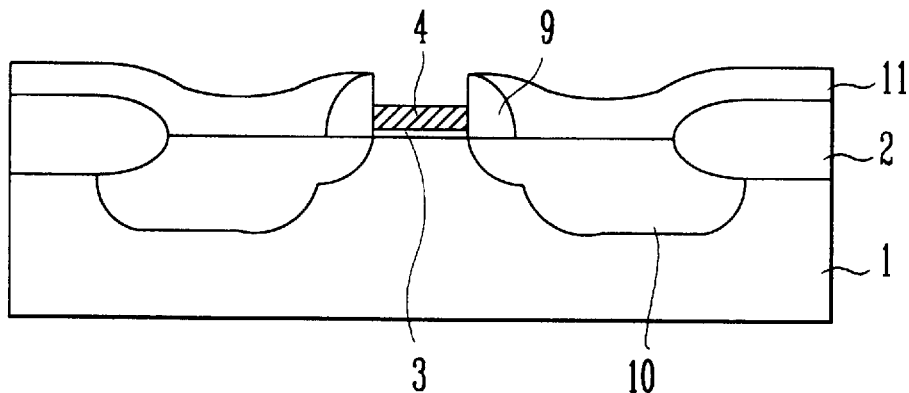
Figure 1K:
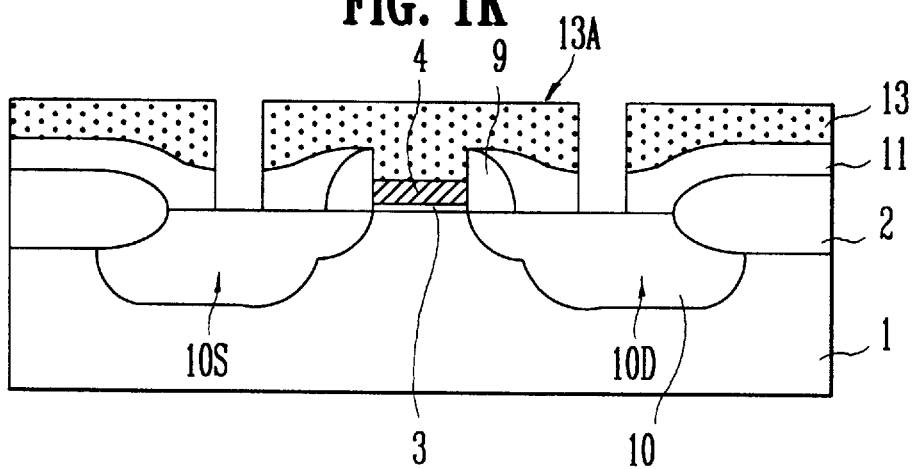
Figure 1L:
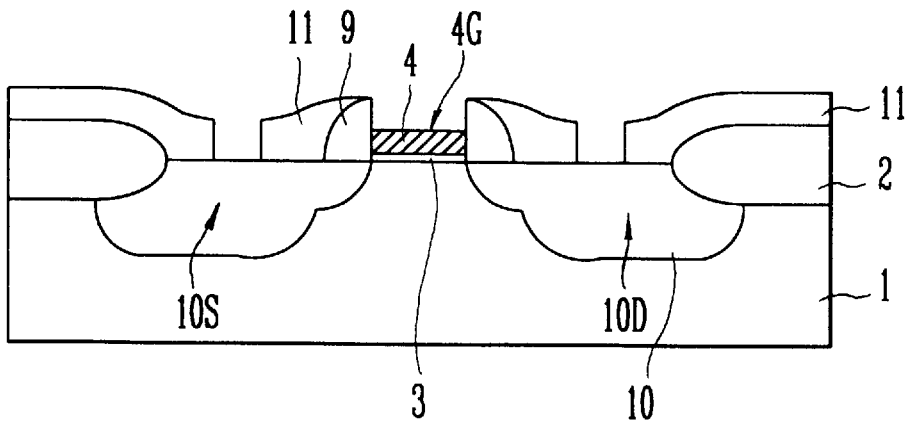
Figure 1M:
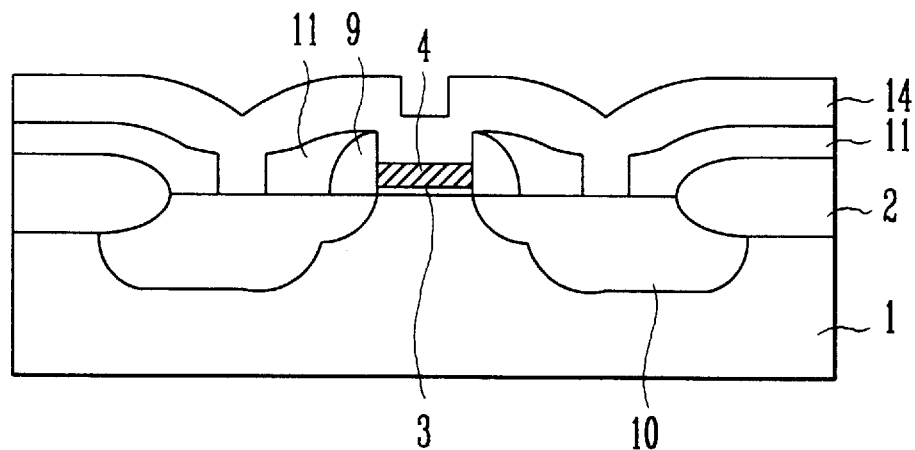
Figure 1N:
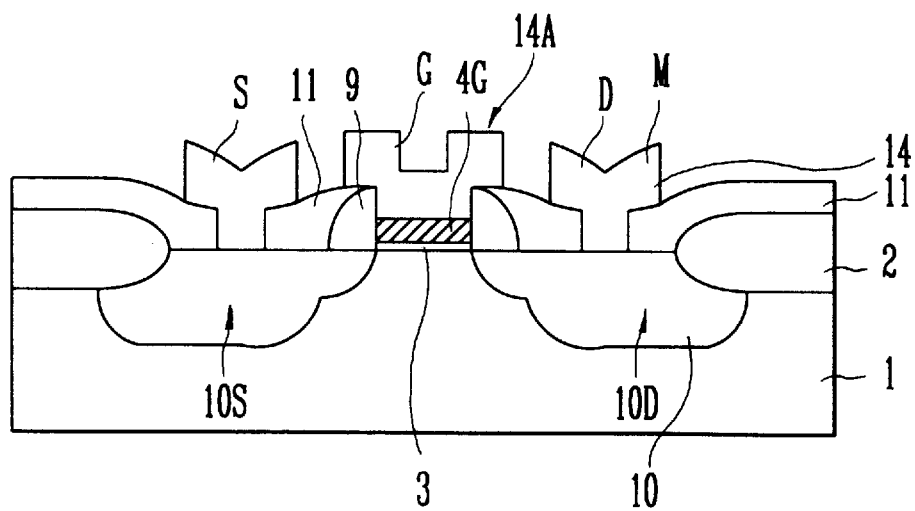

Now, a method for manufacturing a semiconductor device according to the present invention will described more in detail with reference to FIGS. 1A to 1N.

FIGS. 1A to 1N are process steps sequentially illustrating a method for manufacturing a semiconductor device having a stacked gate electrode structure of self-aligned polysilicon-metal according to the present invention.

Referring now to FIG. 1A, it represents that a field oxide layer 2 is formed on a portion of a silicon substrate 1, and a gate oxide layer 3 is then grown on the silicon substrate 1. A first polysilicon layer 4 is deposited on the entire surface of the structure. It is noted that the manufacturing process used to the process of forming the conventional silicon semiconductor memory device is applied to the structure mentioned above. A first oxide layer 5 and a second polysilicon layer 6 are sequentially deposited on the first polysilicon layer 4. Here, the first oxide layer 5 and the second polysilicon layer 6 are deposited for the purpose of forming a metal gate electrode of the present invention. At the time, the thickness of the first oxide layer 5 is determined in consideration of the thickness of the oxide layer lost during the etching process of the second polysilicon layer 6, so as to allow an uniform thickness of the oxide layer to be remained after the etching process of the polysilicon layer. Preferably, the materials of the first oxide layer 5 and the second polysilicon layer 6 may be used by selecting the plural of a nitride layer, a polysilicon layer, an oxide layer or etc., each have an etch selectivity capable of using the etch-back process and the etching process of the material for gate electrode structure which are used in the present invention.

In FIG. 1B, it shows that, in order to form a gate electrode, a first photoresist layer 7 is coated on the second polysilicon layer 6 and a mask pattern for gate electrode 7A is locally formed by performing a mask patterning process including a photographic process.

FIG. 1C represents that the second polysilicon layer 6, the first oxide layer 5, the first polysilicon layer 4 and the gate oxide layer 3 are sequentially removed using the mask pattern for gate electrode 7A shown in FIG. 1B to thereby define a first type of the gate electrode structure.

Turning to FIG. 1D, it shows that the mask pattern for gate electrode 7A shown in FIG. 1C is removed. A doping process of impurity is then applied to the entire surface of the resulting structure in order to form a $N^{31}$ and a $P^{31}$ region into the silicon substrate 1, thereby forming a lightly doped diffusion (LDD) region at the both side of the gate electrode structure into the silicon substrate 1, as shown in the drawing. Here, it should be noted that, in the drawing, the impurity having a low density is introduced by using an ion implantation by sequentially performing a photo-mask patterning process which is well known in the art.

In FIG. 1E, it represents that a second oxide layer 8 is deposited on the entire surface of the resulting structure into which the impurity having a low density is introduced. The purpose of depositing the second oxide layer 8 is to form an oxide spacer 9 for the LDD region of the gate electrode, which will be described in connection with FIG. 1F. Here, the oxide spacer 9 for the LDD region is formed by performing a dry etching process with respect to the second oxide layer 8 without using an additional mask, such that an uniform thickness of the second oxide layer 8 remains at the both sides of the gate electrode structure,and removed it other region.

FIG. 1F shows that, in order to further form a $N^{30}$ and a $P^{31}$ region 10 which respectively defines a source region 10S and a drain region 10D into the LDD region of the silicon substrate 1, a process of ion implantation is then applied to the entire surface of the resulting structure, as shown in the drawing. It is also noted that in the drawing, the impurity having a high density is introduced by using the ion implantation by sequentially performing a photo-mask patterning process which is well known in the art. In order to effectively diffuse and activate the impurity into the silicon substrate 1, the resulting structure is then heated at a high temperature using a furnace which is widely used in this art, such that the source region 10S and a drain region 10D is formed having a predetermined depth, as shown in the drawing.

Referring now to FIG. 1G, it illustrates that an doped oxide layer 11 used as an interdielectric layer is deposited on the entire surface of the resulting structure including the oxide spacer 9 and the field oxide layer 2. Here, a BPSG oxide layer containing a Boron (B) and a Phosphorus (P) is used as the doped oxide layer 11. The resulting structure is then heated to locally planarize the top surface of the doped oxide layer 11. It should be noted that, in order to prevent the impurity of the BPSG oxide layer from being diffused, an undoped oxide layer may firstly be deposited on the entire surface of the resulting structure, prior to depositing the BPSG oxide layer.

Turning now to FIG. 1H, it represents that after the top surface of the resulting structure is locally planarized using the doped oxide layer 11, a spin-on glass (SOG) layer 12 is then coated on the doped oxide layer 11 in order to secondary planarize the surface of the resulting structure, as shown in the drawing.

In FIG. 1I, it represents that the resulting structure planarized by the doped oxide layer 11 and the spin-on glass (SOG) layer 12 is then removed by performing a SOG etch-back process which is one of the dry etching processes without using an additional mask, until the top surface of the second polysilicon layer 6 which defines the gate electrode structure is completely exposed.

FIG. 1J illustrates that the exposed second polysilicon layer 6 and the underlying first oxide layer 5 are removed to thereby expose the top surface of the first polysilicon layer 4. Here, the second polysilicon layer 6 and the underlying first oxide layer 5 are selectively removed under the condition of etching process due to the difference in etch selectivity between polysilicon and oxide, without performing an additional etching process, such that the first polysilicon layer 4 so exposed forms the shape of the self-aligned gate electrode structure required to form the metal layer. At the time, the etch loss in the oxide spacer 9 and the field oxide layer 2 which may be possibly occurred during the process of etching the second polysilicon layer 6 can be minimized due to the high etch selectivity between polysilicon and oxide.

Referring now to FIG. 1K, it shows that a second photoresist layer 13 is coated on the entire surface of the resulting structure in order to form contact holes through the doped oxide layer 11 above the source region 10S and the drain region 10D. Predetermined portions of the second photoresist layer 13 is then removed to form a mask pattern for contact hole 13A, thereby exposing portions of the doped oxide layer 11 above the source region 10S and the drain region 10D. The exposed portions of the doped oxide layer 11 are also removed by using oxide etch processing for forming source 10S and drain 10D region. Respectively, such that a portion of the source region 10S and the drain region 10D is exposed, as shown in the drawing.

In FIG. 1L, it represents that the self-aligned gate electrode structure 4G, the source region 10S and the drain region 10D are formed, after the remaining mask pattern for photoresist layer 13 is removed. The features of the self-aligned gate electrode structure lies in that the height of the oxide spacer 9 is higher than that of the first polysilicon layer 4 which is used as the gate electrode, so that the self-aligned gate electrode structure 4G required to form the metal layer can be formed. Further, a stable electrical characteristics of the resulting device can be obtained by eliminating the etch loss of the oxide spacer 9 occurred during the etching process as mentioned hereinbefore.

In FIG. 1M, a metal layer 14, such as for example Al, is deposited on the entire surface of the resulting structure. Here, the metal layer 14 is deposited using the manufacturing method of forming the conventional silicon semiconductor memory device.

Turning now to FIG. 1N, it represents that a metal M is formed by a mask patterning process of the metal layer 14 which is the same method as in FIG. 1K and thus is not shown for the simplicity of the description. Consequently, a resulting device having a source electrode S, a drain electrode D and a gate electrode G which are respectively electrically connected to the source region 10A, drain region 10D and gate electrode structure 4G, is completed.

As fully described above, according to the method for manufacturing a semiconductor device of the present invention, it has superior advantages that the conventional technique generally used in the manufacturing process of forming the silicon semiconductor device can be effectively utilized. Further, an excessive etch loss in the oxide layer can be restrained by using the oxide spacer of the self-aligned oxide layer in forming the metal layer at the gate electrode structure. Furthermore, it has an advantageous effect that the stable electrical characteristics of the resulting device can be obtained by using the polysilicon layer as the basic constituting material of the gate electrode thereof.

The present invention has been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. A method for manufacturing a semiconductor device having a stacked gate electrode structure comprising:

preparing a silicon substrate;

forming a field oxide layer on a portion of the silicon substrate;

growing a gate oxide layer on the silicon substrate;

sequentially depositing a first polysilicon layer, first oxide layer and second polysilicon layer on the entire surface of the resulting structure;

coating a first photoresist layer on the second polysilicon layer and for gate electrode at a predetermined portion on the second polysilicon layer;

sequentially removing the second polysilicon layer, the first oxide layer, the first polysilicon layer and the gate oxide layer using the mask pattern for gate electrode to thereby define a gate electrode structure;

removing the mask pattern for gate electrode;

introducing an impurity having a low density into the entire surface of the resulting structure to form a lightly doped diffusion region at the both side of the gate electrode structure into the silicon substrate;

depositing a second oxide layer on the entire surface of the resulting structure;

forming an oxide spacer at the both side of the gate electrode structure by a dry etching process of the second oxide layer;

introducing an impurity having a high density into the entire surface of the resulting structure to define a source region and a drain region into the lightly doped diffusion region of the silicon substrate;

depositing an doped oxide layer used as an interdielectric layer on the entire surface of the resulting structure including the oxide spacer and the field oxide layer;

heating the doped oxide layer and locally planarizing the top surface of the doped oxide layer;

coating a spin-on glass (SOG) layer on the doped oxide layer to secondary planarize the surface of the resulting structure;

removing the resulting structure planarized by the doped oxide layer and the spin-on glass (SOG) layer by performing a SOG etch-back process, until the top surface of the second polysilicon layer in the gate structure is exposed;

sequentially removing the exposed second polysilicon layer and the underlying first oxide layer to expose the top surface of the first polysilicon layer in the gate structure;

coating a second photoresist layer on the entire surface of the resulting structure and removing predetermined portions of the second photoresist layer to form a mask pattern for contact hole, thereby exposing portions of the oxide layer above the source region and the drain region;

removing the exposed portions of the doped oxide layer using the mask pattern for contact hole to define the contact holes for the source region and the drain region, to thereby expose a portion of the source region and the drain region;

removing the mask pattern for contact hole;

depositing a metal layer on the entire surface of the resulting structure; and forming a metal on the source region, drain region and gate electrode structure by removing portions of the metal layer, thereby forming a source electrode, a drain electrode and a gate electrode which are respectively electrically connected to the source region, drain region and gate electrode structure.

2. The method for manufacturing a semiconductor device according to claim 1, wherein the first oxide layer is used to prevent the loss of the first polysilicon layer occurred during the etching process of the second polysilicon layer, and the thickness of the first oxide layer is determined in consideration of the thickness of the oxide layer lost during the etching process of the second polysilicon layer.

3. The method for manufacturing a semiconductor device according to claim 1, wherein the first oxide layer and the second polysilicon layer is used by selecting the plural of a nitride layer, a polysilicon layer or an oxide layer each have an etch selectivity capable of using the etch-back process and the etching process for the gate electrode structure.

4. The method for manufacturing a semiconductor device according to claim 1, wherein the second polysilicon layer and the first oxide layer are selectively removed under the condition of etching process depending on the difference in etch selectivity between polysilicon and oxide, without performing an additional process.

5. The method for manufacturing a semiconductor device according to claim 1, wherein a metal layer is Al.

\* \* \* \* \*